US009575118B2

(12) United States Patent
Bode

(10) Patent No.: US 9,575,118 B2
(45) Date of Patent: Feb. 21, 2017

(54) SEMICONDUCTOR DEVICE COMPRISING AN OUTPUT DRIVER CIRCUITRY, A PACKAGED SEMICONDUCTOR DEVICE AND ASSOCIATED METHODS

(75) Inventor: Hubert Bode, Haar (DE)

(73) Assignee: NXP USA, Inc., Austin, TX (US)

( * ) Notice: Subject to any disclaimer, the term of this patent is extended or adjusted under 35 U.S.C. 154(b) by 337 days.

(21) Appl. No.: 14/379,892

(22) PCT Filed: Feb. 24, 2012

(86) PCT No.: PCT/IB2012/050856
§ 371 (c)(1),
(2), (4) Date: Aug. 20, 2014

(87) PCT Pub. No.: WO2013/124711
PCT Pub. Date: Aug. 29, 2013

(65) Prior Publication Data
US 2015/0002183 A1    Jan. 1, 2015

(51) Int. Cl.
*G01R 31/28* (2006.01)
*H01L 23/00* (2006.01)
*G05F 1/46* (2006.01)

(52) U.S. Cl.
CPC ....... *G01R 31/2896* (2013.01); *G01R 31/2853* (2013.01); *G05F 1/462* (2013.01);
(Continued)

(58) Field of Classification Search
CPC . G01R 31/2896; G01R 31/2853; G05F 1/462; H01L 24/49; H01L 24/06; H01L 2924/00014; H01L 2924/1305; H01L 2224/05554; H01L 2924/13091; H01L 24/48; H01L 2224/49113; H01L 2224/48091; H01L 2924/00; H01L 2224/45099; H01L 2224/05599
See application file for complete search history.

(56) References Cited

U.S. PATENT DOCUMENTS 5,124,660 A    6/1992  Cilingiroglu
7,075,175 B2   7/2006  Kazi et al.
(Continued)

FOREIGN PATENT DOCUMENTS

AT    WO 2008046904 A1 *  4/2008  ......... G01R 31/2853
WO       2008046904 A1     4/2008

OTHER PUBLICATIONS

International Search Report and Written Opinion correlating to PCT/IB2012/050856 dated Nov. 14, 2012.

*Primary Examiner* — Son Le

(57) ABSTRACT

A semiconductor device comprises a plurality of output pads bondable to an output pin, a plurality of reference pads bondable to a reference pin, and output driver circuitry with a control terminal for receiving a control signal and arranged to drive the plurality of output pads relative to the plurality of reference pads in dependence on the control signal. The output driver circuitry includes driver sections and selection circuitry. Each driver section is arranged to drive an output pad relative to the single reference pad in dependence on a respective section control signal. The reference pads are connected in a one-to-one relationship to the driver sections. The output pads are connected in a one-to-one relationship to the driver sections. The selection circuitry provides the respective section control signals to the driver sections in dependence on at least one selection signal and the control signal.

19 Claims, 6 Drawing Sheets

(52) U.S. Cl.
CPC .............. *H01L 24/06* (2013.01); *H01L 24/49* (2013.01); *H01L 24/48* (2013.01); *H01L 2224/05554* (2013.01); *H01L 2224/48091* (2013.01); *H01L 2224/49113* (2013.01); *H01L 2924/00014* (2013.01); *H01L 2924/1305* (2013.01); *H01L 2924/13091* (2013.01)

(56) References Cited

U.S. PATENT DOCUMENTS

| | | | |
|---|---|---|---|
| 2003/0029901 A1 | 2/2003 | Ming-Hsun et al. | |
| 2004/0100296 A1* | 5/2004 | Ong ................... | G01R 31/2884 324/750.3 |
| 2007/0035007 A1* | 2/2007 | Dietz .................. | H01L 25/0657 257/700 |
| 2009/0039909 A1 | 2/2009 | Kim et al. | |

* cited by examiner

US 9,575,118 B2

SEMICONDUCTOR DEVICE COMPRISING AN OUTPUT DRIVER CIRCUITRY, A PACKAGED SEMICONDUCTOR DEVICE AND ASSOCIATED METHODS

FIELD OF THE INVENTION

This invention relates to a semiconductor device comprising an output driver circuitry, a packaged semiconductor device, and methods for testing and conditioning such packaged semiconductor device.

BACKGROUND OF THE INVENTION

A semiconductor device is commonly provided in a package as a packaged semiconductor device. The packaged semiconductor device usually has a plurality of pins, allowing to connect the packaged semiconductor device to other devices by, typically, soldering. The pins of the packaged semiconductor device are connected to pads of the semiconductor device with bonds, such as bond wires or bond bumps. A pin carrying a small signal is usually connected to a single pad with a single bond, as such single bond may easily carry the current of such a small signal. However, when large signals are involved, such as in a power driver circuit having a power transistor capable of providing a large current, multiple bonds are needed to carry the associated large current: a single pin is then usually connected with a plurality of bonds to a plurality of pads. This plurality of pads is then driven in parallel from the power transistor, whereby each pad and corresponding bonds carries a part of the large current. For example, for a 1 A power transistor, two bonds for carrying 500 mA each may be used, or even 10 bonds for carrying 100 mA each.

To allow proper functioning of the packaged semiconductor device initially and over its intended lifetime, it may be required that all bonds are correctly connected to the pin of the package and the pads of the semiconductor device. If for example for the 1 A power transistor with two bonds mentioned above, one of the bond wires would not be correctly connected, the other bond wire would have to conduct the full current of 1 A, whereby this other bond wire may fail after some time of operation because this other bond wire will be overstressed. Although a large majority of incorrectly connected bonds may be detected by testing the packaged semiconductor device immediately after the bonding has been performed during its manufacturing, a fraction of incorrectly connected bonds may pass such test. A packaged semiconductor device having such incorrectly connected bonds may be insufficiently reliable, as it may e.g. result in device failure after the packaged semiconductor device has been used for a prolonged period.

There is thus a wish to provide an improved packaged semiconductor device. There may be a wish to provide an improved method of testing whether all bonds are correctly connected in a packaged semiconductor device.

SUMMARY OF THE INVENTION

The present invention provides a semiconductor device comprising an output driver circuitry, a packaged semiconductor device, a method of testing such packaged semiconductor device a method of conditioning such packaged semiconductor device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 1:
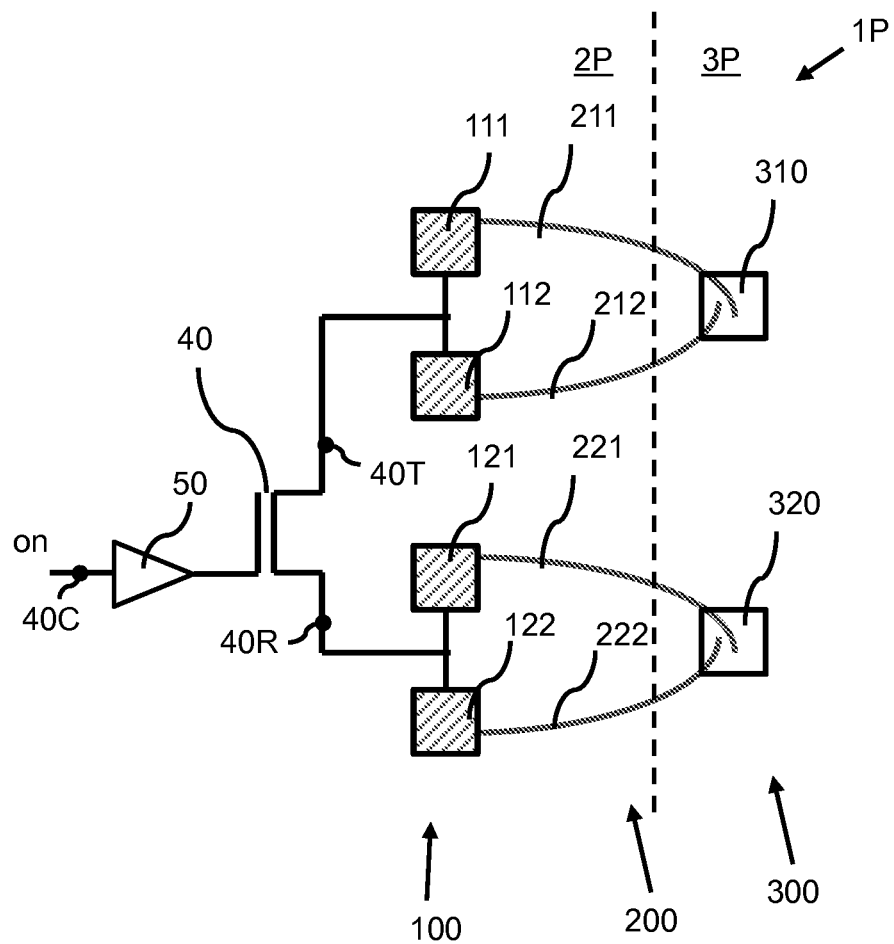
FIG. 1 schematically shows an example of a prior art packaged semiconductor device.

FIG. 1 schematically shows an example of a prior art packaged semiconductor device 1P comprising a semiconductor device 2P and a package 3P. The package 3P comprises a plurality of pins 300. The plurality of pins comprises an output pin 310 and a reference pin 320. The semiconductor device 1P comprises a plurality of pads 100. The plurality of pads 100 comprises a plurality of output pads 111, 112 and plurality of reference pads 121, 122. The pads 100 are bonded with bond wires 200 to the pins 300. All output pads 111, 112 of the plurality of output pads 111, 112 are bonded with a respective plurality of bond wires 211, 212 to the output pin 310 of the package 3P. All reference pads 121, 122 of the plurality of reference pads are bonded with a respective plurality of further bond wires 221, 222 to the reference pin 320 of the package 2P.

The semiconductor device 2P further has an output driver 40, in this example a power transistor, having a reference terminal 40R, an output terminal 40T and a control terminal 40C. The control terminal 40C is provided with a control signal buffer 50. The reference terminal 40R is connected to all reference pads 121, 122. The output terminal 40T is connected to all output pads 111, 112. The output driver 40 is hereby arranged to receive a control signal "on" on the control terminal 40C and to drive the plurality of output pads 111, 112 relative to the plurality of reference pads 121, 122 in dependence on the control signal. For example, if the control signal "on" corresponds to a logical '1', the output driver 40 allows a current of 1 A to flow to the output pads 111, 112, whereas, if the control signal corresponds to a logical '0', the output driver 40 inhibits current flow.

An exemplary packaged semiconductor device 1P may have a low-ohmic power transistor as the output driver 40 designed to deliver a current of 1 A and having a driver resistance of 1 ohm as a nominal value. Such exemplary packaged semiconductor device 1P may use two bond wires 211, 212 for connecting the output pads 111, 112 to the output pin 310, and two further bond wires 221, 222 for connecting the reference pads 121, 122 to the reference pin 320. Each bond wire 211, 212 and each further bond wire 221, 222 may have a resistance of 0,2 ohm. The parallel arrangement of the two correctly bonded bond wires 211, 212 may thus have a resistance of 0,1 ohm between the output pads 111, 112 and the output pin 310. Likewise for two correctly bonded further bonds wires 221, 222. A total output resistance between the reference pin 320 and output pin 310 may thus be 0.1+1+0.1=1.2 ohm if both bond wires 211, 212 as well as both further bond wires 221, 222 are correctly connected. When however e.g. bond wire 211 would be not be correctly bonded, only a single bond wire 212 would connect the semiconductor device to the output pin 310 with a resistance of 0.2 ohm for the connection, and a total output resistance between the reference pin 320 and output pin 310 may thus be 0.2+1+0.1=1.3 ohm, and thus 0,1 ohm different from the 1.2 ohm mentioned above, which suggests that testing the total resistance may be used to detect whether one (or more) bond wires or further bonds wires are incorrectly bonded. However, the spread of the components may be of a similar or even larger size. E.g., the driver resistance may vary between 0,7 and 1,3 ohm, which would no longer allow to detect all incorrect bonds.

Figure 2:
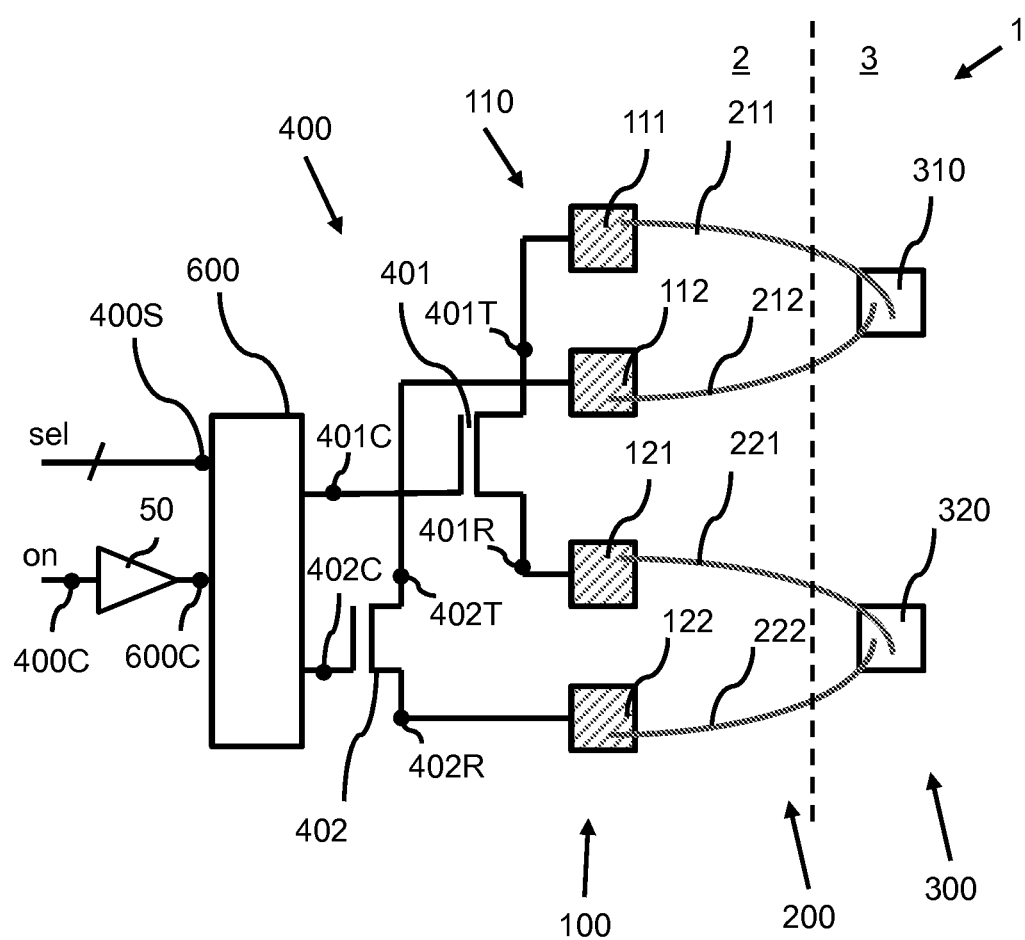
FIG. 2 schematically shows an example of a packaged semiconductor device according to an embodiment.

FIG. 2 schematically shows an example of a packaged semiconductor device 1 according to an embodiment. The packaged semiconductor device 1 comprises a semiconductor device 2 and a package 3. The package 3 comprises a plurality of pins 300. The plurality of pins comprises an output pin 310 and a reference pin 320. The semiconductor device 1 comprises a plurality of pads 100. The plurality of pads 100 comprises a plurality of output pads 111, 112 and plurality of reference pads 121, 122. The pads 100 are bonded with bond wires 200 to the pins 300. All output pads 111, 112 of the plurality of output pads 111, 112 are bonded with a respective plurality of bond wires 211, 212 to the output pin 310 of the package 3. All reference pads 121, 122 of the plurality of reference pads are bonded with a respective plurality of further bond wires 221, 222 to the reference pin 320 of the package 2.

The semiconductor device 2 further has an output driver circuitry 400 having a plurality of driver sections 401, 402, a control terminal 400C for receiving a control signal and a selection circuitry 600. Each driver section 401, 402 has a driver control terminal 401C, 402C for receiving a section control signal. Each driver section 401, 402 has a section reference terminal 401R, 402R and a section output terminal 401T, 402T. The semiconductor device 2 thus has a plurality of section reference terminals 401R, 402R and a plurality of section output terminals 401T, 402T associated with respective driver sections 401, 402 of the plurality of driver sections.

Each section reference terminal 401R, 402R is connected to a respective single reference pad 121, 122 from the plurality of reference pads. That is, section reference terminal 401R is connected to reference pad 121 but not to reference pad 122, while section reference terminal 402R is connected to reference pad 122 but not to reference pad 121. Likewise is each section output terminal 401T, 402T connected to a respective single output pad 111, 112 from the plurality of output pads.

The selection circuitry 600 has at least one selection input terminal 400S for receiving at least one selection signal, indicated as "sel". The selection circuitry 600 further has a selection control terminal 600C connected, via a control signal buffer 50, to the control terminal 400C for receiving the control signal from the control terminal 400C. The selection circuitry 600 further has a plurality of selection output terminals 601C, 602. Each selection output terminal of the plurality of selection output terminals is connected to a respective section control terminal 401C, 402 of a respective driver section 401, 402 of the plurality of driver sections and arranged to provide respective section control signals to each of the section control terminals 401C, 402C of the plurality of driver sections in dependence on the at least one selection signal and the control signal.

The plurality of reference pads 121, 122 is connected in a one-to-one relationship to the plurality of driver sections 401, 402. Hereby, the plurality of reference pads 121, 122 is connected to the plurality of section reference terminals 401R, 402R formed by all section reference terminals of the plurality of driver sections.

The plurality of output pads 111, 112 is connected in a one-to-one relationship to the plurality of driver sections 401, 402. Hereby, the plurality of output pads 111, 112 is connected to the plurality of section output terminals 401T, 402T formed by all section output terminals of the plurality of driver sections.

Each of the driver sections 401, 402 is hereby arranged to drive one output pad 111 or 112 relative to one associated reference pad 121 or 122 in dependence on the respective section control signal for the respective driver section 401, 402. Thus, driver section 401 is arranged to drive output pad 111 relative to reference pad 121 in dependence on the section control signal provided at section control terminal 401C, while driver section 402 is arranged to drive output pad 112 relative to reference pad 122 in dependence on the section control signal provided at section control terminal 402C.

The output driver circuitry 400 may hereby be arranged to receive the control signal on the control terminal and capable to drive the plurality of output pads 111, 112 relative to the plurality of reference pads 121, 122 in dependence on the control signal by applying a suitable at least one selection signal to the output driver circuitry.

The at least one selection signal may comprise a plurality of section enable signals for selectively enabling or disabling corresponding driver sections. For example, the at least one selection signal "sel" may comprise a "up_en"-signal for enabling driver section 401 and a "down_en"-signal for enabling driver section 402. The section control signals provided to each of the section control terminals 401C, 402C of the plurality of driver sections are derived by the selection circuitry 600 in dependence on the selection signal and the control signal. The skilled person will appreciate that alternative embodiments of the alternative embodiments of the at least one selection signal may be used, such as e.g. an analogue signal. Further, the at least one selection signal may be e.g. a real-time signal or a signal storable and retrievable from a memory element such as a register accessible by the selection circuitry. In alternative or further embodiments, the at least one selection signal may be buffered in a buffer circuit (not shown separately) and the selection circuitry may be operable to obtain the at least one selection signal from the buffer. The selection circuitry may comprise a buffer circuit for holding the at least one selection signal as lastly received by the at least one selection input terminal 400C. The last value(s) of the at least one selection signal may thus be maintained without the need to continuously apply an at least one selection signal. Such buffer circuit may hereby e.g. allow storing values of the selection signal corresponding to enabling all driver sections of the plurality of driver sections on a normal operation mode of the driver circuitry. The buffer circuit may comprise a memory element such as a register or a plurality of registers.

In an embodiment, the selection circuitry 600 is operable in a plurality of modes, the mode being selectable in dependence on the at least one selection signal. The plurality of modes may comprise a test mode corresponding to enabling driver sections of the plurality of driver sections one at a time. The driver circuitry 400 may thus be operated with one driver section at a time in the test mode. Hereby, individual driver sections and electrical connections thereto may be tested, such as the series arrangement of output pin 310, connection of bond wire 211 to output pin 310, bond wire 211, connection of bond wire to output pad 111, output pad 111, connection of output pad 111 to output terminal 401T of the corresponding driver section 401, series resistance of driver section 401, connection of reference terminal 401C to reference pad 121, reference pad 121, connection of further bond wire 221 to reference pad 121, further bond wire 221, connection of further bond wire 221 to reference pin 320 and reference pin 320. The plurality of modes may further comprise a normal operation mode, the normal operation mode corresponding to enabling all driver sections simultaneously. The driver circuitry 400 may thus be operated to drive an externally connected device connected between the output pin 310 and the reference pin 320 with a total drive signal corresponding to a sum of the drive signals from all driver sections of the plurality of driver sections. For example, with a plurality of N driver sections, each comprising a power transistor operable as a switch, each drive section may be associated with a drive current of 1/N-th of a total drive current.

In alternative embodiments, the plurality of driver sections consists of two driver sections, three driver sections or four driver sections. The output pin 310 may thus be connected via respectively two, three or four bonds 211, 212 to respective output pads 111, 112, which output pads being connected to the respective driver sections 401, 402. Similarly may the reference pin be connected via respectively two, three or four bonds 212, 222 to respective reference pads 121, 122, which reference pads being connected to the respective driver sections 401, 402. With the plurality of driver sections being two, three or four, the total device area required to provide the output pads and reference pads such that they may be bonded with a bond wire and to provide routing on the semiconductor device 2 from the driver sections 401, 402 to the output pads 111, 112 and reference pads 121, 122 may be advantageous compared to a larger number of driver sections, output pads and reference pads. For devices as described with reference to FIG. 1, such larger number could e.g. be considered if the skilled person would want to improve device robustness against an incorrect or failing bond by using a large number of bonds, whereby a failure of one of the bonds would only result in a low increase in drive signal for the other bonds. E.g., when using ten bonds per pin, the load on each of the nine correct bonds would only increase by 10% if one bond would fail. Compared to such packed semiconductor devices, the total device area used may thus be reduced while simultaneously improving the reliability. Further, with the plurality of driver sections 401, 402 being two, three or four, the risk that an incorrect bonding is made may be reasonably low and the yield of manufacturing packaged semiconductor devices may be higher, whereas a larger number may result in a smaller yield.

In an embodiment, each driver section is arranged to drive the single output pad 111, 112 relative to the single reference pad 121, resp. 122 with an amperage in a range of 10 mA to 2 A. In an embodiment, each driver section being arranged to drive the single output pad 111, 112 relative to the single reference pad 121, resp. 122 with an amperage in a range of 100 mA to 1 A. For these amperage ranges, reliability of bonds may be especially important as the bonds need to withstand a relatively large current. It may however be noted that the invention may also be applied at other amperages.

According to an embodiment, each driver section 401 comprises a power transistor connected between the section reference terminal 401R and the section output terminal 401T of the driver section 401 and the section control terminal 401C being arranged to control the power transistor. In an embodiment, the power transistor is a MOSFET. The section control terminal may thus correspond to the gate of the MOSFET. The section reference terminal 401R and section output terminal 401T may correspond to source and drain of the MOSFET, the correspondence depending on the power transistor being a P-type or N-type transistor. The selection circuitry 600 may thus be substantially directly connected to the gates of the MOSFETs of the driver sections 401. In another embodiment, the power transistor is a bipolar junction transistor (BJT). The section control terminal may thus correspond to the base of BJT. The section reference terminal 401R and section output terminal 401T may correspond to emitter and collector of the BJT, the correspondence depending on the BJT being a PNP-type or NPN-type transistor. The selection circuitry 600 may thus be substantially directly connected to the bases of the BJTs of the driver sections 401.

Figure 3:
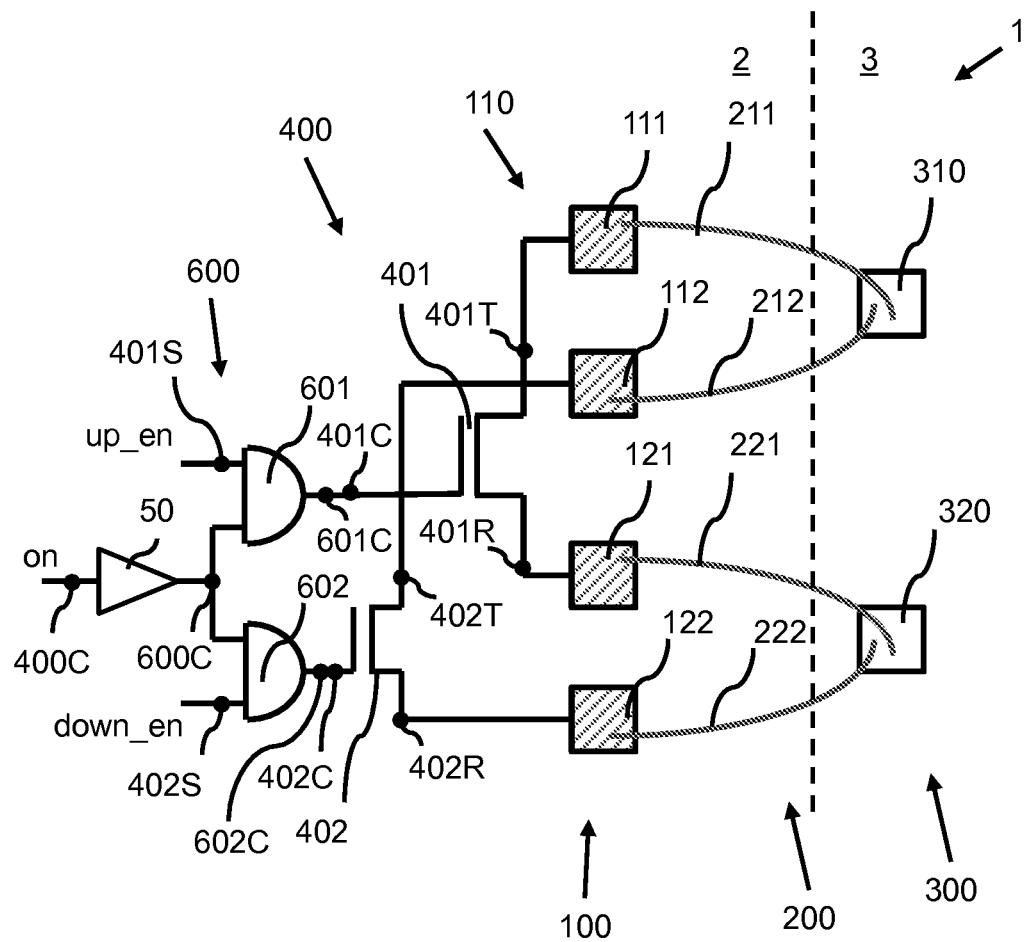
FIG. 3 schematically shows an example of a packaged semiconductor device according to a further embodiment.
Figure 4:
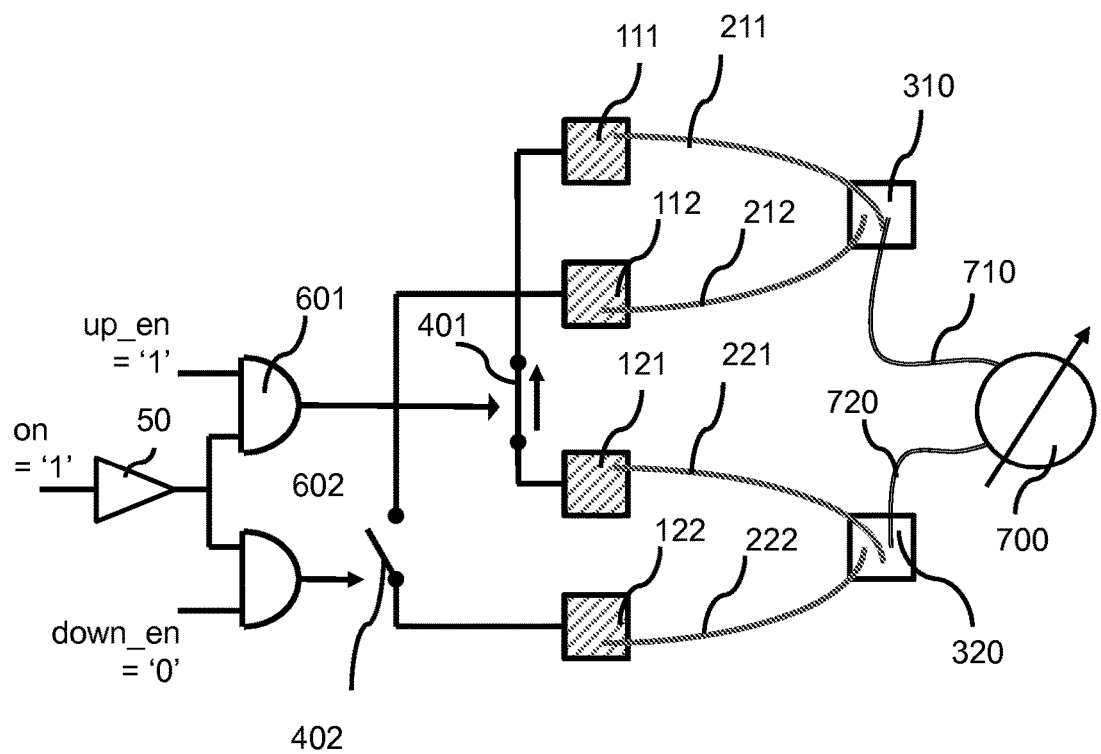
FIG. 4 and FIG. 5 schematically show an example of an embodiment of a method of testing a packaged semiconductor device.

FIG. 3 schematically shows an example of the packaged semiconductor device 1 of FIG. 2 according to a further embodiment. FIG. 4 shows an exemplary embodiment of a selection circuitry 600. In this exemplary embodiment, the at least one selection input terminal 400S comprises a plurality of selection inputs 401S, 402S. The at least one selection signal "sel" comprises a plurality of section enable signals for selectively enabling or disabling corresponding driver sections. In this example, the plurality of section enable signals comprises the an "up_en"-signal, provided to selection input terminal 401S, for enabling driver section 401 and a "down_en"-signal, provided to selection input terminal 402S, for enabling driver section 402. In this example, each of the plurality of section enable signals is offered as an individual signal. The exemplary embodiment of the selection circuitry 600 comprises two logical AND units 601, 602. Each logical AND unit 601, 602 is arranged to perform a logical AND action between one of the section enable signals and the control signal. Logical AND unit 601 performs an AND between the "up_en"-signal and the control signal to obtain the via its section control signal for driver section 401. If both the "up_en"-signal as well as the control signal are '1', driver section 401 is enabled and controlled to deliver current via its section control signal; if the "up_en" signal is '1' while the control signal is '0', driver section 401 is enabled and controlled not to deliver current; if the "up_en"-signal is '0', driver section 401 is effectively disabled and controlled not to deliver current, irrespective of the control signal. The selection circuitry 600 may thus be operated to provide a test mode, wherein the driver sections 401 and 402 are enabled one-at-a-time, and normal operation mode, wherein both driver sections 401 and 402 are enabled, in dependence on the "up_en"-signal and the "down_en" signal according to the following table:

TABLE 1

| "up_en" | "down_en" | driver section 401 | driver section 402 | Mode |
|---|---|---|---|---|
| '1' | '0' | Enabled | Disabled | Test mode - conductivity 211-401-221 |
| '0' | '1' | Disabled | Enabled | Test mode - conductivity 212-402-222 |
| '1' | '1' | Enabled | Enabled | Normal operation mode |

The logical AND units 601, 602 may each comprise a buffer circuit at their respective inputs to buffer the at least one selection signal. The skilled person will appreciate that alternative embodiments of the selection circuit may be used, e.g. using alternative logical circuitry.

The selection circuitry 600 may thus be arranged to select, in a test mode, only one of the driver sections, i.e. enabling only one driver section while disabling all others for testing (as will be explained below with reference to FIG. 4 and FIG. 5), or to select, in a normal operation mode, all driver sections. Hereby, in test mode, only one driver section from the plurality of driver sections delivers a current, while in the normal operation mode, all driver sections from the plurality of driver sections deliver current in parallel. When each of the output pads 111, 112 is correctly bonded to the output pin 310, these currents are, during normal operation, summed at the output pin 310 to deliver a total drive current from the driver circuitry 400.

Figure 5:
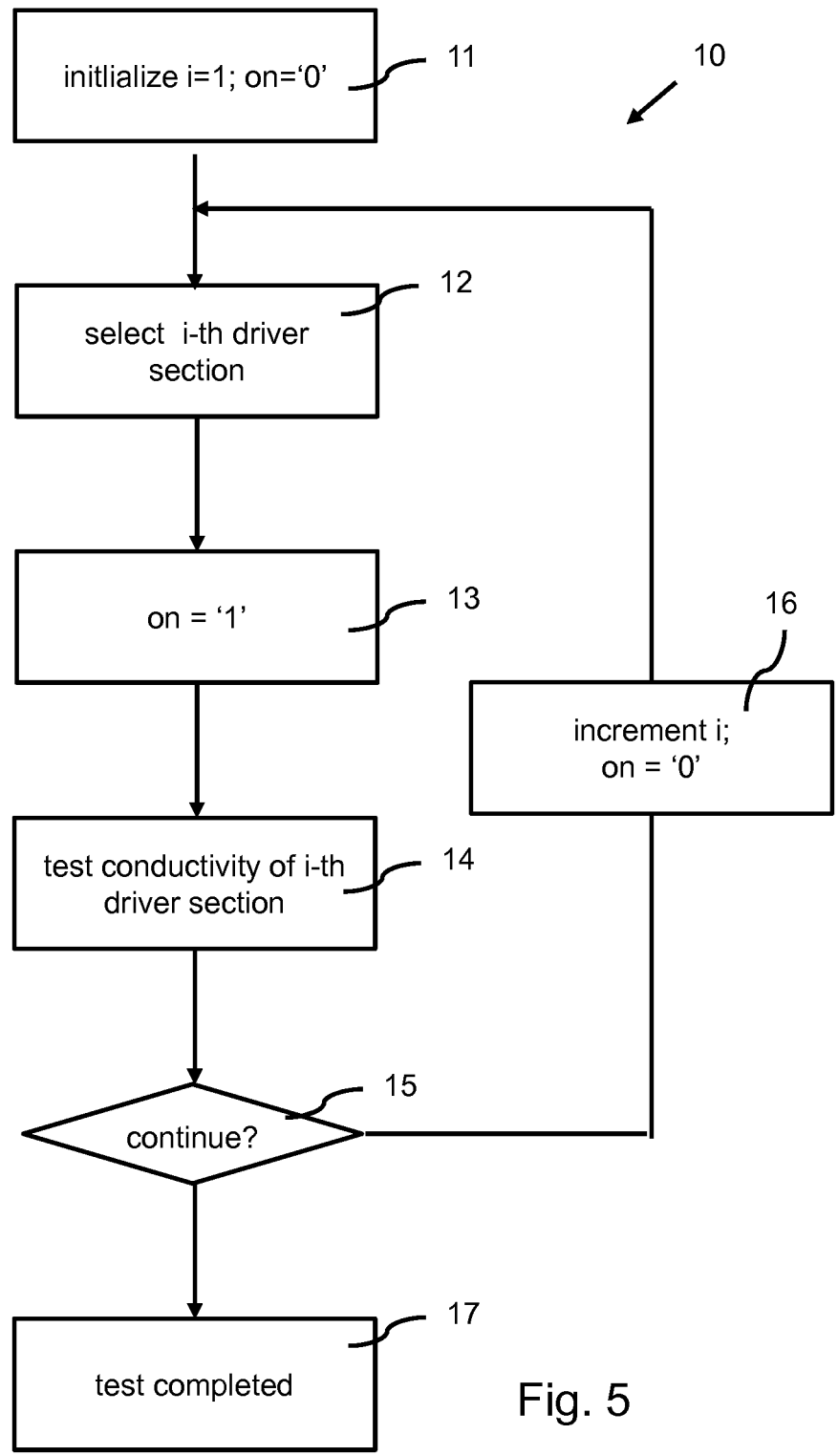

FIG. 4 and FIG. 5 schematically show an example of an embodiment of a method of testing a packaged semiconductor device. The non-limiting example is described with reference to the packaged semiconductor device 1 shown in FIG. 3 having two driver sections 401, 402, which are in this example each comprising a power transistor. FIG. 5 shows a block diagram of the method wherein a test mode according to an embodiment is used. The method starts with an initialization block 11. In the initialization block 11, the control signal "on" is set to '0' and delivered to the control terminal 400C. The driver circuitry 400 is hereby arranged to control the driver circuitry 400 to be inactive. Further, a counter i is initialized to a start value i=1. In a next selection block 12, the at least one selection signal "sel" is conditioned to enable the i-th driver section while disabling all other driver sections. Thus, in this example, the at least one selection signal "sel" comprises the two selection signals "up_en" and "down_en", and "up_en" is set to an enable value '1' to enable driver section 401 and "down_en" is set to a disable value '0' to disable driver section 402. The two selection signals are then delivered to the respective selection inputs 401S, 402S. Then, in an activation block 13, the control signal 'on' is set to '1' to activate the driver circuitry in the test mode according to the settings of the at least one selection signal. Hereby, the driver section 401 is activated and drives the output pad 111 relative to the reference pad 121, as schematically indicated with a symbol indicating a closed switch 401 in FIG. 4, while driver section 402 remains inactive, as schematically indicated with a symbol indicating an open switch 402. The power transistor of driver section 401 forms hereby a conductive path between its reference terminal 401R and its output terminal 401T, while the power transistor of driver section 402 is non-conductive between its reference terminal 402R and its output terminal 402T. Then, in a test block 14, the conductivity between the reference pin 320 and the output pin 310 is tested while the driver circuitry is activated with the control signal being set to '1' and the at least one selection signal "sel" being set to enable the i-th driver section while disabling all other driver sections. For the exemplary embodiment described above, these conductivities are referred to in Table 1 as "conductivity 211-401-221" for driver section 401 and "conductivity 212-402-222" for driver section 402. This testing may further be referred to as testing the conductivity of the i-th driver section. The conductivity may e.g. be tested by measuring the resistance between the reference pin 320 and the output pin 310 by connecting a resistance meter 700 with meter leads 710 and 720 between the reference pin 320 and the output pin 310, as schematically indicated in FIG. 4. For example, when driver section 401 is activated and driving the output pad 111 relative to the reference pad 121, the measured resistance will have a value representing substantially a sum of resistances of the resistance of bond wire 211, the resistance of driver section 401 and the resistance of further bond wire 211 if the wire bond 211 is correctly connecting the output pin 310 to the output pad 111 and also further bond wire 221 is correctly connecting the reference pin 320 to the reference pas 121. Thus sum of resistance which will typically sum up to several ohms. However, if the wire bond 211 is not correctly connecting the output pin 310 to the output pad 111, no conductive connection will have been formed between the reference pin 320 and the output pin 310, and the resistance will be substantially infinite. Likewise will the resistance be substantially infinite if further bond wire 221 is not correctly connecting the reference pin 320 to the reference pas 121. A conclusion may thus be drawn on whether both bond wire 211 and further bond wire 221 are correctly bonded from measuring the conductivity between the output pin 310 and the output pad 111 while the i-th driver section 401 is enabled and activated and the other driver sections are disabled. The conductivity may be measured as a resistance. The conductivity, or the resistance, may be measured as a numerical value. The numerical value may be tested against a pre-determined threshold value to conclude whether or not the output pin 310 and reference pin 320 are electrically connected via the bond 211 and further bond 221. Alternatively, the conductivity may be measured to just discriminate whether the conductivity is substantially zero or substantially finite. Likewise may the resistance be measured to just discriminate whether the resistance is substantially finite or substantially infinite. A 'substantially infinite' resistance may e.g. correspond to a resistance outside a measurable range of the meter. After testing the conductivity of the i-th driver section 401, a decision block 15 may decide whether the test is completed in a completion block 17, or whether the test continues to test the next driver section, in a loop increment block 16, incrementing counter and setting the control signal "on" back to '0', and then continuing the method as from selection block 12 to test the conductivity of the next driver section 402. The decision block 15 may, in one embodiment, continue to the loop increment block 16 until all driver sections of the plurality of driver sections have been tested. In another embodiment, the decision block 15 may continue to the loop increment block 16 as long as it has been concluded that both the bond wire 211 as well as the further bond wire 212 of the tested driver section 401 were correctly bonded, while the decision block may immediately proceed to the completion block 17 as soon as it has been concluded that at least one of the bond wire and the further bond wire associated with a driver section is not correctly connected. The completion block 17 may finally conclude whether all bond wires and all further bond wires were correctly connected and the packaged semiconductor device 1 may be considered as having passed the test, or whether at least one of the bond wires and further bond wires was not correctly connected and the packaged semiconductor device 1 may be considered as having failed the test and is to be rejected.

Hereby, the embodiment provides a method of testing a packaged semiconductor 1 comprising a semiconductor device 2 according to any one of the embodiments described above and a package 3 having an output pin 310 and a reference pin 320, the method comprising:

a) repeatedly performing a sequence of actions of:
 a.1) conditioning and providing 12 the at least one selection signal to the at least one selection input terminal 400S of the selection circuitry 600 to select a single driver section 401, or 402, of the plurality of driver sections 401, 402,
 a.2) conditioning and providing 13 the control signal "on" to the control terminal 400C of the output driver circuitry 400 to activate the single driver section, and
 a.3) testing 14 a conductivity between the output pin 310 and the reference pin 320, the testing comprising obtaining a measure of the conductivity and comparing the measure against a pre-determined threshold level to obtain a comparison result; and
b) concluding 17 whether the output pin 310 is connected to all output pads 111, 112 of the plurality of output pads of the semiconductor device 1 and the reference pin 320 is connected to all reference pads 121, 122 of the plurality of reference pads of the semiconductor device 1.

The repeatedly performing of the sequence of actions a.1)-a.3) may be performed until the conductivity between the output pin 310 and the reference pin 320 has been tested for all driver sections of the plurality of driver sections. Alternatively, the repeatedly performing of the sequence of actions a.1)-a.3) may be performed until, for one driver section, the conductivity between the output pin 310 and the reference pin 320 has been found to correspond to an incorrect bond between a pad and a pin.

Testing the packaged semiconductor device may further comprise measuring the resistance between the output pin 310 and the reference pin 320 in a normal operation mode and obtaining a further comparison result from comparing the resistance measured in the normal operation mode with a calculated resistance obtained from calculating a resistance value of a parallel arrangement of all resistance values as measured during the testing of the conductivity of each of the driver sections. The further comparison result may be compared against a further threshold to determine whether the measured resistance in the normal mode matches the calculated resistance or not, and from that conclude whether the output pin 310 is connected to all output pads 111, 112 of the plurality of output pads of the semiconductor device 1 and the reference pin 320 is connected to all reference pads 121, 122 of the plurality of reference pads of the semiconductor device 1.

The skilled person will appreciate that variants of the method may be designed that are within the scope of the attached claims. E.g., the loop increment block 16 may be implemented using alternative embodiments wherein, for example, the control signal "on" is not switched, but remains to be '1' while the driver circuitry is switching to enable the next driver section.

For comparison with the example given with reference to FIG. 1, an example is described according to an embodiment. An exemplary packaged semiconductor device 1 may have two low-ohmic power transistors as the driver sections 401, 402. The driver sections 401, 402 are designed to together deliver a current of 1 A, i.e. each individual driver section is designed to deliver a current of 500 mA. Each driver section may have a driver resistance of 2 ohm as a nominal value. Such exemplary packaged semiconductor device P may use two bond wires 211, 212 for connecting the output pads 111, 112 to the output pin 310, and two further bond wires 221, 222 for connecting the reference pads 121, 122 to the reference pin 320. Each bond wire 211, 212 and each further bond wire 221, 222 may have a resistance of 0,2 ohm. A correctly bonded bond wire 211 may thus have a resistance of 0,2 ohm between the output pad 111 and the output pin 310. Likewise may a correctly bonded further bond wire 221 a resistance of 0,2 ohm between the reference pad 121 and the reference pin 320. A total output resistance between the reference pin 320 and the output pin 310 may thus be 0,2+2+0,2=2.4 ohm if both bond wire 211 as well as both further bond wire 221 are correctly connected and only driver section 501 is enabled and controlled to deliver current. When however e.g. bond wire 211 would be not be correctly bonded, there would be no connection between the output pin 310 and the semiconductor device, and the total output resistance would be infinite. Hereby, the detection whether a bond may be incorrect or not may no longer need to rely on a comparison of exact numerical values of the resistance and may be reliably performed, also e.g. in the presence of a relatively large spread in e.g. driver section resistance. The risk that packaged semiconductor devices with one or more incorrectly bonded bonds pass the test may thus be considerably reduced.

Another aspect provides a method of conditioning a packaged semiconductor device 1 according to an embodiment, the method comprising conditioning and providing the at least one selection signal "sel" to the at least one selection input terminal 400S of the selection circuitry 600$n$ to select all driver sections 401, 402 of the plurality of driver sections. Hereby, the packaged semiconductor device 1 may be conditioned for use in normal operation.

Another embodiment provides a method of testing and conditioning a packaged semiconductor device 1, the method comprising testing the packaged semiconductor device using a method of testing as described above, and conditioning the packaged semiconductor device using a method of conditioning as described above. Hereby, a packaged semiconductor device 1 may be provided that has passed the test and is conditioned for use in normal operation. Such packaged semiconductor device 1 may have an improved reliability compared to prior art packaged semiconductor devices as described e.g. with reference to FIG. 1.

The embodiments described above describe a packaged semiconductor device wherein bond wires are used to bond the pads of the semiconductor device to the pins of the package. The embodiments thus provide a package semiconductor device, the output pin being connected to all output pads using a plurality of bond wires, each bond wire connecting one of the output pads to the output pin, and the reference pin being connected to all reference pads using a plurality of further bond wires, each further bond wire connecting one of the reference pads to the reference pin.

In alternative embodiments, bond bumps may be used to bond pads of the semiconductor device to pins of the package, e.g. with the semiconductor device being flip-chip mounted to the package. Alternative embodiments may thus provide a package semiconductor device, the output pin being connected to all output pads using a plurality of bond bumps and the reference pin being connected to all reference pads using a plurality of further bond bumps. Usually, using bond bumps may have the disadvantage that the testing whether the bonds are correctly formed may be further complicated as the bond bumps are usually not visible and thus cannot be individually inspected visually using normal microscopy but only using e.g. X-ray microscopy. The method for testing described above may obviate the need for such visual or X-ray inspection, as the selective operation of individual power sections may allow to test the bond bumps electrically.

Figure 6:
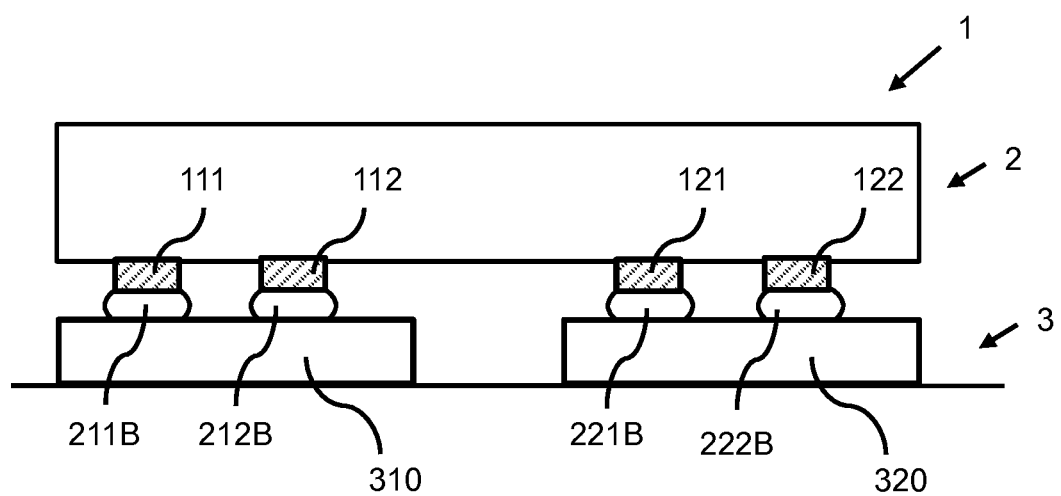
FIG. 6 schematically shows an example of a packaged semiconductor device according to again a further embodiment.

FIG. 6 schematically shows an example of a packaged semiconductor device 1 according to an example of such alternative embodiment. As in the embodiment shown in FIG. 2, the packaged semiconductor device 1 comprises a semiconductor device 2 and a package 3. The package 3 comprises an output pin 310 and a reference pin 320. The semiconductor device 1P comprising a plurality 100 of output pads 111, 112 and plurality of reference pads 121, 122. The packaged semiconductor device 1 show in FIG. 6 differs from packaged semiconductor device 1 show in FIG. 2 in that the bonding is not achieved by soldered bond wires connecting the pads of the semiconductor device 2 to the pins of the package, but using an alternative, well-known bond technique, of using bond bumps in so-called flip-chip mounting technology. Hereby, all output pads 111, 112 of the plurality of output pads 111, 112 are bonded with a respective plurality of bond bumps 211B, 212B to the output pin 310 of the package 3, and all reference pads 121, 122 of the plurality of reference pads are bonded with a respective plurality of further bond bump 221B, 222B to the reference pin 320 of the package 2. It will be appreciated that the embodiments and examples as described with reference to bond wires may be similarly be embodied with bond bumps. In another embodiment, all output pads 111, 112 of the plurality of output pads 111, 112 may be bonded with a respective plurality of bond bumps 211B, 212B to the output pin 310 of the package 3, and all reference pads 121, 122 of the plurality of reference pads may be bonded with a respective plurality of further bond wires 221, 222 to the reference pin 320 of the package 2. In another embodiment, all output pads 111, 112 of the plurality of output pads 111, 112 may be bonded with a respective plurality of bond wires 211, 212 to the output pin 310 of the package 3, and all reference pads 121, 122 of the plurality of reference pads may be bonded with a respective plurality of further bond bumps 221B, 222B to the reference pin 320 of the package 2.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections may be any type of connection suitable to transfer signals from or to the respective nodes, units or devices, for example via intermediate devices. Accordingly, unless implied or stated otherwise the connections may for example be direct connections or indirect connections.

Each signal described herein may be designed as positive or negative logic, where negative logic can be indicated by a bar over the signal name or an asterix (*) following the name. In the case of a negative logic signal, the signal is active low where the logically true state corresponds to a logic level zero, which may be referred to as '0'. In the case of a positive logic signal, the signal is active high where the logically true state corresponds to a logic level one, which may be referred to as '1'. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention. For example, those skilled kin the art may appreciate that or the semiconductor device 2 may comprise further components integrated in and on the semiconductor device and/or e.g. further pads than what has been explicitly shown in the figures and described in the text. Similarly may the packaged semiconductor device 1 comprise further components in the same package, or externally connected to the package.

Also, devices functionally forming separate devices may be integrated in a single physical device. Likewise, units described as separate units may be integrated into a single unit. Also, units described as being part of a larger unit may be provided as separate units. For example, the buffer circuit arranged to hold the at least one selection signal may be a component separate from the selection circuitry, or integrated in the selection circuitry. The same applies for the control signal buffer 50.

However, other modifications, variations and alternatives are also possible. The specifications and drawings are, accordingly, to be regarded in an illustrative rather than in a restrictive sense.

For example, the at least one selection signal may be conditioned and provided in different ways. In an embodiment, the at least one selection signal may be conditioned by a device tester externally to the packaged semiconductor device and provided to the packaged semiconductor device via a test pin, e.g. using a device tester in a production line in a manufacturing facility. In another embodiment, the at least one selection signal may be conditioned by an on-chip controller.

In the claims, any reference signs placed between parentheses shall not be construed as limiting the claim. The word 'comprising' does not exclude the presence of other elements or steps then those listed in a claim. Furthermore, Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

The invention claimed is:

1. A semiconductor device for use in a package comprising an output pin and a reference pin, the semiconductor device comprising a plurality of output pads bondable to the output pin, a plurality of reference pads bondable to the reference pin, and an output driver circuitry having a control terminal for receiving a control signal and arranged to drive the plurality of output pads relative to the plurality of reference pads in dependence on the control signal, the output driver circuitry comprising a plurality of driver sections and a selection circuitry, each driver section having a driver control terminal for receiving a section control signal, a section reference terminal and a section output terminal, the section reference terminal connected to a single reference pad from the plurality of reference pads, the section output terminal connected to a single output pad from the plurality of output pads, the driver section being arranged to drive the single output pad relative to the single reference pad in dependence on the section control signal, the plurality of reference pads being connected in a one-to-one relationship to the plurality of driver sections, the plurality of output pads being connected in a one-to-one relationship to the plurality of driver sections, the selection circuitry having at least one selection input terminal for receiving at least one selection signal, a selection control terminal connected to the control terminal for receiving the control signal, a plurality of selection output terminals, each selection output terminal of the plurality of selection output terminals being connected to a respective section control terminal of a respective driver section of the plurality of driver sections and arranged to provide respective section control signals to each of the section control terminals of the plurality of driver sections in dependence on the at least one selection signal and the control signal.

2. A semiconductor device according to claim 1, the selection circuitry being operable in a plurality of modes, the mode being selectable in dependence on the at least one selection signal, the plurality of modes comprising a test mode and a normal operation mode, the test mode corresponding to enabling driver sections of the plurality of driver sections one at a time, the normal operation mode corresponding to enabling all driver sections simultaneously.

3. A semiconductor device according to claim 1, the plurality of driver sections consisting of two driver sections.

4. A semiconductor device according to claim 1, the plurality of driver sections consisting of three driver sections.

5. A semiconductor device according to claim 1, the plurality of driver sections consisting of four driver sections.

6. A semiconductor device according to claim 1, each driver section being arranged to drive the single output pad relative to the single reference pad with an amperage in a range of 10 mA to 2 A.

7. A semiconductor device according to claim 5, each driver section being arranged to drive the single output pad relative to the single reference pad with an amperage in a range of 100 mA to 1 A.

8. A semiconductor device according to claim 1, each driver section comprising a power transistor connected between the section reference terminal and the section output terminal of the driver section and the section control terminal being arranged to control the power transistor.

9. A semiconductor device according to claim 1, the selection circuitry comprising a buffer circuit for holding the at least one selection signal as lastly received by the at least one selection input terminal.

10. A packaged semiconductor device, comprising a semiconductor device according to claim 1 and a package having an output pin and a reference pin, the output pin being connected to all output pads of the plurality of output pads of the semiconductor device and the reference pin being connected to all reference pads of the plurality of reference pads of the semiconductor device.

11. A packaged semiconductor device according to claim 10, the output pin being connected to all output pads using a plurality of bond wires, each bond wire connecting one of the output pads to the output pin, and the reference pin being connected to all reference pads using a plurality of further bond wires, each further bond wire connecting one of the reference pads to the reference pin.

12. A packaged semiconductor device according to claim 10, the output pin being connected to all output pads using a plurality of bond bumps and the reference pin being connected to all reference pads using a plurality of further bond bumps.

13. A method of testing a packaged semiconductor device and a package having an output pin and a reference pin, the method comprising:

conditioning and providing a selection signal to a selection input terminal of the selection circuitry to select a single driver section of a plurality of driver sections, conditioning and providing a control signal to a control terminal of an output driver circuitry to activate the single driver section, and testing a conductivity between an output pin and an reference pin, the testing comprising obtaining a measure of a conductivity and comparing the measure conductivity against a pre-determined threshold level to obtain a comparison result; and concluding whether the output pin is connected to all output pads of a plurality of output pads of the semiconductor device and a reference pin is connected to all reference pads of a plurality of reference pads of the semiconductor device.

14. The method of claim 13, the method further comprising:

conditioning and providing the selection signal to the at least one selection input terminal of the selection circuitry to select all driver sections of the plurality of driver sections.

15. The method of claim 13, the method further comprising:

in response to the selection signal having a first value, operating the packaged semiconductor device in a test mode to enable driver sections of the plurality of driver sections one at a time; and in response to the selection signal having a second value, operating the packaged semiconductor device in a normal operation mode to enable all driver sections simultaneously.

16. The method of claim 13, further comprising:
driving, by each driver section, the single output pad relative to the single reference pad with an amperage in a range of 10 mA to 2 A.

17. The method of claim 13, further comprising:
driving, by each driver section, the single output pad relative to the single reference pad with an amperage in a range of 100 mA to 1 A.

18. A semiconductor device for use in a package comprising an output pin and a reference pin, the semiconductor device comprising:
a plurality of output pads bondable to the output pin;
a plurality of reference pads bondable to the reference pin; and
an output driver circuitry having a control terminal to receive a control signal, the output driver circuitry to drive the plurality of output pads relative to the plurality of reference pads based on the control signal, the output driver circuitry comprising:
a plurality of drivers comprising first and second drivers,
the first driver having a first driver control terminal to receive a first control signal, a first reference terminal and a first output terminal, the first reference terminal connected to a first reference pad from the plurality of reference pads, the first output terminal connected to a first output pad from the plurality of output pads, the first driver to drive the first output pad relative to the first reference pad based on the first control signal, and
the second driver having a second driver control terminal to receive a second control signal, a second reference terminal and a second output terminal, the second reference terminal connected to a second reference pad from the plurality of reference pads, the second output terminal connected to a second output pad from the plurality of output pads, the second driver to drive the second output pad relative to the second reference pad based on the second control signal; and
selection circuitry comprising:
a selection input terminal to receive a selection signal;
a selection control terminal connected to the control terminal to receive the control signal;
a plurality of selection output terminals including first and second output terminals,
the first selection output terminal connected to the first control terminal of the first driver and arranged to provide the first control signal to the first control terminal based on the selection signal and the control signal, and
the second selection output terminal connected to the second control terminal of the second driver and arranged to provide the second control signal to the second control terminal based on the selection signal and the control signal.

19. The semiconductor device of claim 18, the selection circuitry being operable in a plurality of modes, the mode being selectable based on the selection signal, the plurality of modes comprising a test mode and a normal operation mode, the test mode corresponding to enabling the first and second drivers one at a time, the normal operation mode corresponding to enabling the first and second drivers simultaneously.

* * * * *